US011947264B2

(12) United States Patent
Limpens et al.

(10) Patent No.: US 11,947,264 B2
(45) Date of Patent: Apr. 2, 2024

(54) GUIDING DEVICE

(71) Applicant: ASML NETHERLANDS B.V., Veldhoven (NL)

(72) Inventors: Patrick Willem Paul Limpens, Uden (NL); Gerard Johannes Boogaard, Zaltbommel (NL); Michaël Johannes Anna Maria Walters, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 254 days.

(21) Appl. No.: 17/608,505

(22) PCT Filed: Apr. 3, 2020

(86) PCT No.: PCT/EP2020/059695
§ 371 (c)(1),
(2) Date: Nov. 3, 2021

(87) PCT Pub. No.: WO2020/224893
PCT Pub. Date: Nov. 12, 2020

(65) Prior Publication Data
US 2022/0229372 A1    Jul. 21, 2022

(30) Foreign Application Priority Data
May 9, 2019  (EP) ..................... 19173417

(51) Int. Cl.
*G03F 7/20* (2006.01)
*G03F 7/00* (2006.01)
(Continued)

(52) U.S. Cl.
CPC ....... *G03F 7/70033* (2013.01); *H02K 41/031* (2013.01); *H05G 2/006* (2013.01); *H02K 2201/18* (2013.01); *H05G 2/008* (2013.01)

(58) Field of Classification Search
CPC .............. G03F 7/70033; H02K 41/031; H02K 2201/18; H05G 2/006; H05G 2/008
See application file for complete search history.

(56) References Cited

U.S. PATENT DOCUMENTS

| 3,935,486 A | 1/1976 | Nagashima |
| 4,607,461 A | 8/1986 | Adams |
(Continued)

FOREIGN PATENT DOCUMENTS

| EP | 0762000 | 3/1997 |
| WO | 2013114520 | 8/2013 |

OTHER PUBLICATIONS

International Search Report and Written Opinion issued in corresponding PCT Patent Application No. PCT/EP2020/059695, dated Jul. 3, 2020.

*Primary Examiner* — Mesfin T Asfaw
(74) *Attorney, Agent, or Firm* — Pillsbury Winthrop Shaw Pittman, LLP

(57) ABSTRACT

An actuator, configured to move a first object with respect to a second object, that includes a first body having an annular ring, a second body, arranged movably with respect to the first body, having a longitudinal shaft at least partially disposed within the annular ring, and at least one spring device, arranged between the first body and the second body, wherein the at least one spring device is configured to guide relative movements between the first body and the second body in a range of movement, and the at least one spring device has two or more leaf springs, wherein each of the two or more leaf springs is connected to the first body and to the second body, and wherein at least one of the leaf springs is in a non-planar state when the spring device is in an equilibrium position.

20 Claims, 7 Drawing Sheets

(51) Int. Cl.
*H02K 41/03* (2006.01)
*H05G 2/00* (2006.01)

(56) References Cited

U.S. PATENT DOCUMENTS

| | | | |
|---|---|---|---|
| 5,052,119 | A | 10/1991 | Eventoff |
| 5,684,856 | A * | 11/1997 | Itoh ................... G03F 7/70716 378/208 |
| 6,952,253 | B2 | 10/2005 | Lof et al. |
| 2005/0139620 | A1 | 6/2005 | Haukamp |
| 2009/0230326 | A1 | 9/2009 | Vaschenko et al. |
| 2017/0047835 | A1* | 2/2017 | Takahashi ............... G01S 7/481 |
| 2018/0027642 | A1* | 1/2018 | Ershov ..................... G03F 7/70 250/504 R |
| 2018/0264903 | A1 | 9/2018 | Stuart et al. |

* cited by examiner

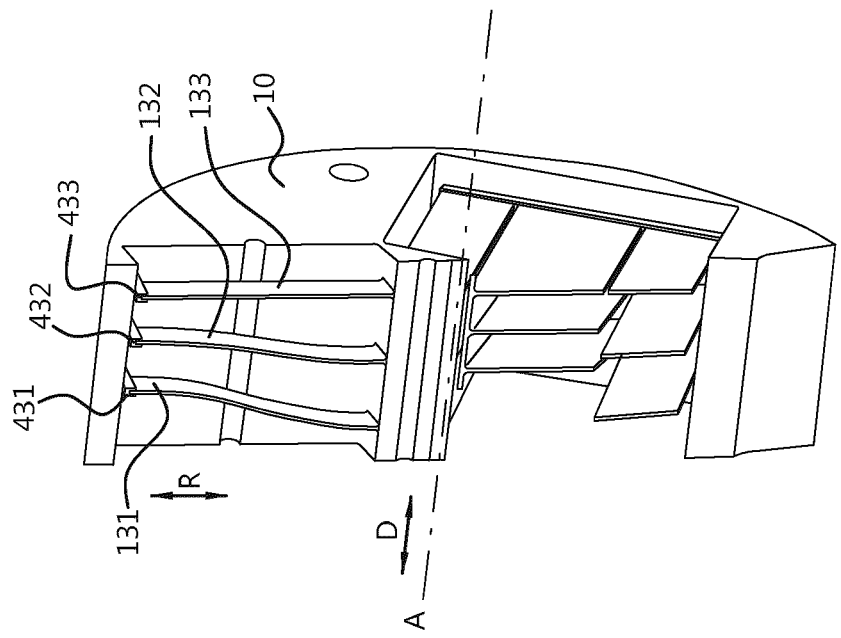
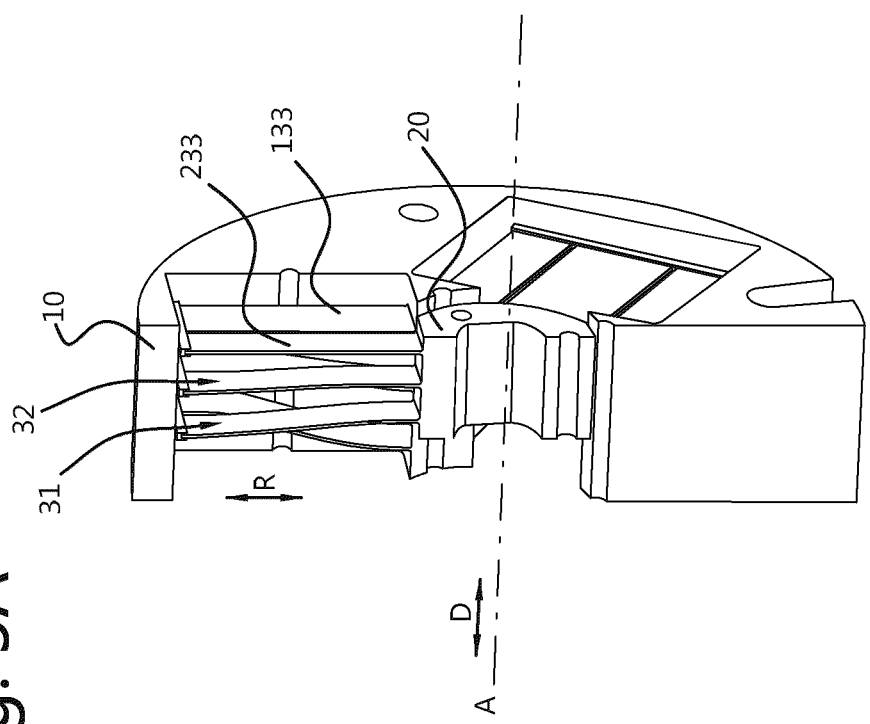

GUIDING DEVICE

CROSS-REFERENCE TO RELATED APPLICATION

The application is the U.S. national phase entry of PCT Patent Application No. PCT/EP2020/059695 which was filed Apr. 3, 2020, which claims the benefit of priority of European Patent Application No. 19173417.7 which was filed on May 9, 2019 and which is incorporated herein in its entirety by reference.

FIELD

The present description relates to an actuator and to a lithographic apparatus that comprises an actuator.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

For the generating of EUV radiation, droplets of tin are illuminated by a laser, by which ultraviolet radiation may be obtained in a desired wavelength spectrum. The tin droplets are discharged by a nozzle of which the position is controlled by a nozzle steering module (NSM). Presently, the nozzle steering module comprises a plurality of linear actuators for the controlling of the position of the nozzle. These linear actuator are each configured to undergo a change in length. Together, the plurality of linear actuators may control a three-dimensional position of the nozzle, in order to steer a direction along which tin droplets are discharged.

The known linear actuators comprise a guiding device with at least one leaf spring to guide a relative displacement between a first body and a second body of the guiding device. Generally, two or more leaf springs are provided opposite to each other. In this configuration, the guiding device is configured to guide relative movements in a displacement direction, for example an x-direction, and to prevent relative movements in two orthogonal directions, e.g. the y- and z-directions.

The leaf spring in the known guiding device may be provided as two-dimensional, e.g. plate-like, elements. The leaf spring thereby extends in a plane that is set perpendicular to the displacement direction. During movement of the guiding device, the leaf spring may become deformed from an equilibrium position, in which the leaf spring may be in a planar state, towards a deflected position, in which the leaf spring is in a non-planar state.

The leaf spring has an out-of-plane stiffness, aligned parallel to the displacement direction, and an in-plane stiffness, aligned perpendicular to the displacement direction. In the planar state of the leaf spring, the in-plane stiffness is significantly larger than the out-of-plane stiffness. This allows the leaf spring to become deformed easily in the displacement direction, but prevents buckling of the leaf spring in an orthogonal direction.

The present guiding device has the disadvantage that the in-plane stiffness of the leaf spring significantly drops when the leaf spring is deflected from the planar state towards the non-planar state, upon movement towards the non-planar state. This drop in in-plane stiffness may be as large as 96% to 99% of the original in-plane stiffness. This has the result that, in the non-planar state of the leaf spring, the guiding device may no longer be able to accurately prevent relative movements in the orthogonal directions, perpendicular to the displacement direction.

It is an object of the present invention to provide a guiding device that overcomes the disadvantages of the known guiding device, or at least to provide an alternative guiding device.

SUMMARY

The present invention provides a guiding device for guiding a linear movement or a rotational movement, comprising:
  a first body,
  a second body, arranged movably with respect to the first body, and
  at least one spring device, arranged between the first body and the second body,
wherein the at least one spring device is configured to guide relative movements between the first body and the second body in a range of movement,
characterized in that the at least one spring device comprises two or more leaf springs, wherein each of the two or more leaf springs is connected to the first body and to the second body, wherein at least one of the leaf springs is in a non-planar state when the spring device is in an equilibrium position.

The guiding device according to the present invention comprises a first body and a second body that are configured to be moved with respect to each other. The guiding device is configured to guide a linear movement between the first body and the second body in a displacement direction or is configured to guide a relative rotation between the first body and the second body, around a rotational axis.

The guiding device is configured to guide these movements in a range of movement, which comprises a range of relative positions between the first body and the second body and which is defined in between a first extreme position and a second extreme position. Within the range of movement, an equilibrium position may be defined as a central position in between the first extreme position and the second extreme position or as a position in which the guiding device is at rest, e.g. its position when no external actuating forces are applied on it.

The first body and the second body are both elements that may each comprise a connection part, with which the respective bodies are configured to be connected to further objects, such as components of a linear actuator or a rotational actuator.

The guiding device according to the present invention further comprises at least one spring device, which is arranged between the first body and the second body and which is connected to the first body and the second body. The spring device is configured to guide the linear movement between the first body and the second body or the rotational movement between the first body and the second body.

The guiding device may comprise a single spring device for the guiding of the relative movements between the bodies. In an embodiment, on the other hand, the guiding comprises two or three spring devices, which may be provided between the bodies on opposite sides of the bodies and in a symmetrical pattern. As such, the multiple spring devices may be configured to ensure linear movements between the bodies or rotations between the bodies, without having relative movements in orthogonal directions.

Each of the at least one spring devices of the guiding device according to the present invention comprises two or more leaf springs. Each of the leaf springs is thereby connected to the first body and to the second body and is configured to deform upon relative movements between the first body and the second body.

The leaf springs of the guiding device are provided as plate-like elements, which may extend in a plane that is perpendicular to the displacement direction of the guiding device or parallel to a rotational axis of the guiding device. At least one of the leaf springs of each spring device is in a non-planar state in the equilibrium position of the spring device. This non-planar leaf spring may thereby have a curved shape and may be deformed from its planar state.

Another one of the leaf springs of each spring device may be in a planar state in the equilibrium position of the spring device. In this planar state, the respective leaf spring may be provided as a two-dimensional plate, having a substantially straight shape. Alternatively or additionally, another one of the leaf springs of each spring device may also be in a non-planar state in the equilibrium position of the spring device, but may be curved in a direction opposite to the direction in which the first non-planar leaf spring is curved.

The guiding device according to the present invention at least partially overcomes the disadvantage of the known guiding devices, since each of the spring devices comprises a non-planar leaf spring in the equilibrium position of the spring device. This non-planar leaf spring may have a relatively small in-plane stiffness, but an overall in-plane stiffness of the respective spring device may be compensated by another leaf spring that may be in a planar state in the equilibrium position of the spring device. This overall in-plane stiffness may be defined as the sum of the in-plane stiffnesses of all leaf springs of the respective spring device.

When the first body and the second body of the guiding device are moved with respect to each other within the range of movement, e.g. from the equilibrium position of the spring device towards the first extreme position or the second extreme position, the non-planar leaf spring may be deformed towards a planar state and the planar leaf spring may be deformed towards a non-planar state. As such, the in-plane stiffness of the non-planar leaf spring is increased upon deformation towards its planar state and upon movement between the first body and the second body of the guiding device, whereas the in-plane stiffness of the planar leaf spring is decreased upon deformation towards its non-planar state and upon movement between the first body and the second body of the guiding device. The overall in-plane stiffness of the respective spring device thus remains relatively high, although the major contribution thereto is shifted from the initially planar leaf spring towards the initially non-planar leaf spring, upon deformation of the spring device.

Similarly, when the first body and the second body were to be moved back towards the equilibrium position of the spring device, the initially non-planar leaf spring is returned from a planar state towards its non-planar state and the initially planar leaf spring is returned from a non-planar state towards its planar state.

As such, the spring devices of the guiding device according to the present invention are configured to provide a relatively constant overall in-plane stiffness upon relative movements between the first body and the second body in the range of movement. The spring devices of the guiding device thereby prevent a significant drop in the overall in-plane stiffness from taking place and thus provide for substantially linear movements between the first body and the second body, without having relative movements of both bodies in orthogonal directions to the displacement direction, or provide for rotations between the first body and the second body, without having any displacements between both bodies.

The guiding device according to the present invention may comprise two or more identical leaf springs in each of the spring devices. These leaf springs may be identical in terms of dimensions and/or materials, such that the mechanical properties and spring characteristics of the leaf springs are identical or at least similar. Alternatively, one or more of the leaf springs may have different dimensions and/or may be made from a different material, in order to provide for different spring characteristics and to allow for optimal tuning of the overall spring characteristics of the respective spring device.

In an embodiment of the guiding device, the leaf spring that is non-planar in the equilibrium position of the spring device, e.g. the non-planar leaf spring, is adapted to be arranged in a planar state when the spring device is moved towards a deflected position within the range of movement. As such, this non-planar leaf spring may be brought from a state in which it has a relatively small in-plane stiffness towards a state in which it has a relatively large in-plane stiffness. In the equilibrium position of the spring device, the contribution of this non-planar leaf spring to an overall in-plane stiffness of the respective spring device may be relatively small, whereas its contribution is relatively large in the deflected position of the spring device.

According to this embodiment, the overall in-plane stiffness of each of the spring devices may be substantially constant and may vary within a bandwidth. The overall in-plane stiffness may for example have a maximum value in the equilibrium position of the spring device and in a deflected position of the spring device, in which the initially non-planar leaf spring is in a planar state. In between the equilibrium position and this deflected position, the overall in-plane stiffness may be lower than the maximum value, defining a minimum value for the bandwidth of the overall in-plane stiffness. In a specific example of this embodiment, the minimum value of the overall in-plane stiffness may be approximately 70% of the maximum value.

In an additional or alternative embodiment of the guiding device, at least another one of the leaf springs is in a planar state when the spring device is in its equilibrium position. In the equilibrium position of the spring device, this planar leaf spring is configured to provide a major contribution to the overall in-plane stiffness of the respective spring device. As such, the planar leaf spring may compensate for the relatively low contribution to the overall in-plane stiffness that is provided by the non-planer leaf spring of the respective spring device, at least in the equilibrium position of the spring device.

In a further embodiment of the guiding device, the leaf spring that is planar in the equilibrium position, e.g. the planar leaf spring, is adapted to be arranged in a non-planar state when the spring device is moved towards a deflected position in the range of movement. As such, this planar leaf spring may be brought from a state in which it has a relatively large in-plane stiffness towards a state in which it has a relatively small in-plane stiffness. In the equilibrium position of the spring device, the contribution of this leaf spring to an overall in-plane stiffness of the respective spring device may be relatively large, whereas its contribution is relatively small in the deflected position of the spring device.

In an embodiment of the guiding device, the leaf spring that is non-planar in the equilibrium position is stress-relaxed. As such, the non-planar leaf spring has a curved and deflected shape in the equilibrium position, but is not substantially pre-loaded with elastic deformation stresses. The stress relaxation provides the advantage that this non-planar leaf spring only becomes stressed when the spring device is brought towards a deflected position. Furthermore, the stress-relaxed leaf spring is configured to force the spring device back towards its equilibrium position when an external force, that holds the spring device in the deflected position, is taken away. As such, the first body and the second body are returned to an initial relative position that corresponds to the equilibrium position of the respective spring device.

In an embodiment, the guiding device is configured to guide a linear movement between the first body and the second body in a displacement direction. This embodiment of the guiding device is thereby configured to allow relative movements between the first body and the second body in the displacement direction, whereas it is configured to prevent movements that have a component in one or both of the orthogonal directions, perpendicular to the displacement direction. The guiding device may furthermore be configured to prevent relative rotations between the first body and the second body.

In a further embodiment of the guiding device, each of the at least one spring devices comprises a first leaf spring and a second leaf spring. The first leaf spring is, with a first end, connected to the first body and, with a second end, connected to the second body. The second leaf spring is, with a first end, connected to the first body and, with a second end, connected to the second body. The first end of the second leaf spring is, in the displacement direction, spaced at a first distance from the first end of the first leaf spring. The second end of the second leaf spring is, in the displacement direction, spaced at a second distance from the second end of the first leaf spring. The first distance is thereby larger than the second distance.

According to this embodiment, a spacing between the first leaf spring and the second leaf spring is larger at their respective first ends than at their respective second ends. As such, the first leaf spring and the second leaf spring may not be aligned parallel to each other in between the first body and the second body. Furthermore, this configuration of both leaf springs may provide that when a first one of the leaf springs is in its non-planar state, having a relatively small in-plane stiffness, a second one of the leaf springs may be in its planar state, having a relatively large in-plane stiffness.

According to this embodiment, the second one of the leaf springs may also be in a non-planar state when the first one of the leaf springs is in its non-planar state. In this configuration, neither one of the leaf springs is in a planar state in the equilibrium position of the respective spring device. However, the overall in-plane stiffness in the equilibrium position of the spring device may be selected to be substantially large, in order to be within a desired bandwidth for the overall in-plane stiffness of the spring device.

The characteristics for the overall in-plane stiffness of the spring device may be set by selecting the spring characteristics of one or more of the individual leaf springs of the respective spring device. The spring characteristics of the leaf springs may thereby be chosen to be the same for all leaf springs or may differ from each other. If, for example, the individual leaf springs are provided relatively long and/or thin, the individual stiffnesses of the leaf springs will be relatively small, resulting in a relatively small overall in-plane stiffness of the respective spring device. If, alternatively, the individual leaf springs are provided relatively short and/or thick, the individual stiffnesses of the leaf springs will be relatively large, resulting in a relatively large overall in-plane stiffness of the respective spring device.

Furthermore, the characteristics for the overall in-plane stiffness of the spring device may be set by selecting appropriate values for the first distance and/or second distance that is present between the leaf springs. The second distance may for example be approximately 0 mm, which may provide that the first ends of both leaf springs are substantially flush with each other.

When the first distance is provided relatively large, the range of movement of the spring device will be relatively large as well, allowing relatively large displacements between the first body and the second body. Furthermore, the bandwidth of the overall in-plane stiffness will be relatively broad, having a relatively large valley in between maximum values for when either one of the leaf springs is in its planar state.

When, alternatively, the first distance is provided relatively small, the range of movement of the spring device will be relatively small as well, allowing relatively small displacements between the first body and the second body. Furthermore, the bandwidth of the overall in-plane stiffness will be relatively narrow, having a relatively small valley in between the maximum values for when either one of the leaf springs is in its planar state.

In a further embodiment of the guiding device, each of the at least one spring devices further comprises a third leaf spring. The third leaf spring is, with a first end, connected to the first body and, with a second end, connected to the second body. The first end of the third leaf spring is, in the displacement direction, spaced at a third distance from the first end of the first leaf spring and the second end of the third leaf spring is, in the displacement direction, spaced at the second distance from the second end of the second leaf spring. The third distance is thereby larger than the second distance.

According to this embodiment, each of the spring devices comprises a third leaf spring, which is positioned adjacent the first leaf spring and the second leaf spring. The provision of a third leaf spring may provide for an increased overall in-plane stiffness of the spring device, since the in-plane stiffness of the third leaf spring forms an additional contribution thereto. Alternatively or additionally, the provision of the third leaf spring may increase the range of movement of the guiding device, provided that it is not positioned in between the first leaf spring and the second leaf spring.

The second end of the third leaf spring is positioned at the second distance from the second end of the second leaf spring. In particular when the second distance is approximately 0 mm, the first ends of the first, second and third leaf springs are all substantially flush with each other. The third distance between the first end of the third leaf spring and the first end of the first leaf spring may be twice the first distance when the third leaf spring is, seen from the first leaf spring, positioned behind the second leaf spring. As such, the range of movement according to this embodiment may also be twice as large as the range of movement of a spring device with only a first leaf spring and a second leaf spring.

In an embodiment of the guiding device, each of the leaf springs comprises a first leaf and a second leaf. The first leaf comprises, seen from the first body, a proximal end and an opposing distal end. The proximal end of the first leaf thereby forms the first end of the respective leaf spring. The second leaf comprises, seen from the second body, a proximal end and an opposing distal end. The proximal end of the second leaf thereby forms the second end of the respective leaf spring. The distal end of the first leaf is fixedly connected to the distal end of the second leaf.

According to this embodiment, each of the leaf springs is composed of a first leaf and a second leaf. The first leaf is connected to the first body with a proximal end and may extend away from the first body in a direction that is substantially perpendicular to the displacement direction. Similarly, the second leaf is connected to the second body with a proximal end and may extend away from the second body in a direction that is substantially perpendicular to the displacement direction. As such, both leafs of the leaf spring may extend perpendicular to the displacement direction. The first leaf is, with its distal end, connected to the distal end of the second leaf. The connection between both leafs is thus set at a distance from the first body and the second body.

When the second body is moved with respect to the first body in the displacement direction, the proximal end of the second leaf, being connected to the second body, is moved away from the proximal end of the first leaf that is connected to the first body. Upon this movement, the first leaf and the second leaf of the leaf spring are both deformed, whereas the connection point between both leafs is also moved with respect to both the first body and the second body. As a result hereof, the deformed leaf spring may be symmetrical in a plane through the connection point and perpendicular to the displacement direction. Accordingly, a possible change in height of the first leaf, perpendicular to the displacement direction, is compensated by a similar change in height of the second leaf. As such, these compensations prevent the occurrence of relative movements between the first body and the second body in directions perpendicular to the displacement direction.

In an alternative embodiment, the guiding device is configured to guide a rotational movement between the first body and the second body in a tangential direction, around a rotational axis. This embodiment of the guiding device is thereby configured to only allow relative rotations between the first body and the second body in the tangential direction and to prevent relative displacements between the first body and the second body.

In the configuration according to this embodiment of the guiding device, the first body and the second body may be arranged concentrically with respect to each other along the rotational axis and may be configured to be rotated with respect to each other around this common rotational axis, in the tangential direction. The at least one spring device of the guiding device is provided in between the first body and the second body. The leaf springs of the respective spring device may thereby extend in a substantially radial direction, in between the first body and the second body. The leaf springs of the spring device may be configured to deform in a tangential direction upon relative rotation between the first body and the second body in the tangential direction.

Where the embodiment of the guiding device comprises more than a single spring device, the spring devices may be disposed evenly around an inner one of the concentric first and second bodies. Such a rotation-symmetrical arrangement of the spring devices may provide that, during relative movements between the first body and the second body, the spring devices are together configured to compensate transverse forces between the first body and the second body. As such, only relative rotations are allowed between the first body and the second body and relative displacements between the first body and the second body are prevented from occurring.

In a further embodiment of the guiding device, each of the at least one spring devices comprises a first leaf spring and a second leaf spring. The first leaf spring is, with a first end, connected to the first body and, with a second end, connected to the second body. The second leaf spring is, with a first end, connected to the first body and, with a second end, connected to the second body. The first end of the second leaf spring is, in the tangential direction, spaced over a first angle from the first end of the first leaf spring. The second end of the second leaf spring is, in the tangential direction, spaced over a second angle from the second end of the first leaf spring. The first angle is thereby larger than the second angle.

According to this embodiment, a spacing in the tangential direction between the first leaf spring and the second leaf spring is larger at their respective first ends than at their respective second ends. As such, the first leaf spring and the second leaf spring may not be aligned parallel to each other in between the first body and the second body. The first leaf spring and the second leaf spring may, for example, be aligned in respective radial directions between the first body and the second body.

This non-parallel configuration of both leaf springs may provide that when a first one of the leaf springs is in its non-planar state, having a relatively small in-plane stiffness, a second one of the leaf springs may be in its planar state, having a relatively large in-plane stiffness.

According to this embodiment, the second one of the leaf springs may also be in a non-planar state when the first one of the leaf springs is in its non-planar state. In this configuration, neither one of the leaf springs is in a planar state in the equilibrium position of the respective spring device. However, the overall in-plane stiffness in the equilibrium position of the spring device may be selected to be substantially large, in order to be within a desired bandwidth for the overall in-plane stiffness of the spring device.

The characteristics for the overall in-plane stiffness of the spring device may be set by selecting the spring characteristics of one or more of the individual leaf springs of the respective spring device. The spring characteristics of the leaf springs may thereby be chosen to be the same for all leaf springs or may differ from each other. If, for example, the individual leaf springs are provided relatively long and/or thin, the individual stiffnesses of the leaf springs will be relatively small, resulting in a relatively small overall in-plane stiffness of the respective spring device. If, alternatively, the individual leaf springs are provided relatively short and/or thick, the individual stiffnesses of the leaf springs will be relatively large, resulting in a relatively large overall in-plane stiffness of the respective spring device.

Furthermore, the characteristics for the overall in-plane stiffness of the spring device may be set by selecting appropriate values for the first angle and/or second angle over which the leaf springs are spaced. The second angle may for example be approximately 0 degrees, which may provide that the first ends of both leaf springs are substantially flush with each other.

When the first angle is provided relatively large, the range of movement of the spring device will be relatively large as well, allowing relatively large rotations between the first body and the second body. Furthermore, the bandwidth of the overall in-plane stiffness will be relatively broad, having a relatively large valley in between maximum values for when either one of the leaf springs is in its planar state.

When, alternatively, the first angle is provided relatively small, the range of movement of the spring device will be relatively small as well, allowing relatively small rotations between the first body and the second body. Furthermore, the bandwidth of the overall in-plane stiffness will be relatively narrow, having a relatively small valley in between the maximum values for when either one of the leaf springs is in its planar state.

In a further embodiment of the guiding device, each of the at least one spring devices further comprises a third leaf spring. The third leaf spring is, with a first end, connected to the first body and, with a second end, connected to the second body. The first end of the third leaf spring is, in the tangential direction, spaced over a third angle from the first end of the first leaf spring and the second end of the third leaf spring is, in the tangential direction, spaced over the second angle from the second end of the first leaf spring and the second end of the second leaf spring. The third angle is thereby larger than the second angle.

According to this embodiment, each of the spring devices comprises a third leaf spring, which is positioned adjacent the first leaf spring and the second leaf spring. The provision of a third leaf spring may provide for an increased overall in-plane stiffness of the spring device, since the in-plane stiffness of the third leaf spring forms an additional contribution thereto. Alternatively or additionally, the provision of the third leaf spring may increase the range of movement of the guiding device, provided that it is not positioned in between the first leaf spring and the second leaf spring.

The second end of the third leaf spring is spaced over the second angle from the second ends of the first leaf spring and the second leaf spring. In particular when the second angle is approximately 0 degrees, the first ends of the first, second and third leaf springs are all substantially flush with each other. The third angle between the first end of the third leaf spring and the first end of the first leaf spring may be twice the first angle when the third leaf spring is, seen from the first leaf spring, positioned behind the second leaf spring. As such, the range of movement according to this embodiment may also be twice as large as the range of movement of a spring device with only a first leaf spring and a second leaf spring.

In an embodiment of the guiding device, the first body comprises an annular ring and the second body comprises a longitudinal shaft that is at least partially disposed within the annular ring. According to this embodiment, the at least one spring device comprises at least two spring devices, which are evenly disposed around the shaft, in between the ring and the shaft.

In the configuration according to this embodiment, the second body is arranged at least partially within the first body. The second body is thereby provided as a longitudinal shaft, which extends along the displacement direction or along the rotational axis.

The longitudinal shaft may be configured to be moved in the displacement direction with respect to the annular ring. As such, either one of the longitudinal shaft or the annular ring may be provided stationary, respectively allowing movements of the annular ring or the longitudinal shaft. Alternatively, the longitudinal shaft may be configured to be rotated around the rotational axis with respect to the annular ring. As such, either one of the longitudinal shaft or the annular ring may be provided stationary, respectively allowing rotations of the annular ring or the longitudinal shaft.

The at least two spring devices are located in a space between the longitudinal shaft and the annular ring, within the annular ring. The spring devices are disposed evenly around the circumference of the longitudinal shaft, in order to compensate radial forces between the longitudinal shaft and the annular ring. As such, relative displacements between the ring and the shaft in orthogonal directions to the displacement direction and the rotational axis may be prevented, in order to ensure relative linear movements between the ring and the shaft in the displacement direction or to ensure relative rotations between the ring and the shaft in the tangential direction, around the rotational axis.

When the guiding device according to this embodiment is configured to guide linear movements between the ring and the shaft, the spring devices may aligned such that the leaf springs of the spring devices are configured to deform in the displacement direction, to allow relative movements between the ring and the shaft in the displacement direction.

When, alternatively, the guiding device according to this embodiment is configured to guide rotational movements between the ring and the shaft, the spring devices may aligned such that the leaf springs of the spring devices are configured to deform in the tangential direction, to allow genuine relative rotations between the ring and the shaft in the tangential direction, around the rotational axis.

In a further embodiment of the guiding device, the at least one spring device comprises three spring devices, which are evenly disposed around the shaft. In this configuration, the three spring devices are disposed within the annular ring and are evenly spaced with respect to each other over an angle of 120 degrees. When one of the three spring devices would, in this configuration, apply a relative force in a first radial direction between the ring and the shaft, the other two spring devices will compensate for this radial force, since the leaf springs of both of the other spring devices are configured to apply spring forces in directions that have a component parallel to the first radial direction.

The present invention further provides an actuator, configured to move a first object with respect to a second object, comprising:

at least one guiding device as described above, configured to guide a relative linear movement or rotational movement between the first object and the second object in a displacement direction or tangential direction, respectively, a coil, comprising one or more coil windings, and a permanent magnet, arranged within the one or more coil windings, wherein the first body of the at least one guiding device is adapted to be connected to the first object and wherein the second body of the at least one guiding device is adapted to be connected to the second object, wherein the coil is associated with one of the first body or the second body and wherein the permanent magnet is associated with the other one of the first body or the second body, and wherein the coil is configured generate a magnetic field when an electric current is applied through the one or more windings and wherein the generated magnetic field is configured to attract or repel the permanent magnet in order to move the first body with respect to the second body in the displacement direction or the tangential direction, respectively.

The actuator is configured to move the first object with respect to the second object, wherein the relative movement may be a back-and-forth displacement in a displacement direction of the at least one guiding device or a back-and-forth rotational movement in a tangential direction of the at least one guiding device, around its rotational axis.

The coil may be connected to the first body of the at least one guiding device, e.g. the annular ring, and the permanent magnet may be connected to the second body of the at least one guiding device, e.g. the shaft. Alternatively, the coil may be connected to the second body and the permanent magnet may be connected to the first body.

During use of the actuator, an electric current may be guided through the coil, by which a magnetic field may be generated. The magnetic field of the coil may interact with the magnetic field of the permanent magnet, resulting in a magnetic force that applied between the coil and the permanent magnet, and thus between the first body and the second body of the at least one guiding device. Under the influence of the magnetic force, the first body and the second body of the guiding device may be moved with respect to each other, thus resulting in a relative movement between the first object and the second object.

In particular, the relative movement between the objects may correspond to a relative movement of the at least one guiding device in a range of movement of at least one spring device thereof. The relative movement may, upon actuation by the actuator, take place from an equilibrium position of the at least one spring device towards a deflected position of the at least one spring device.

When the electric current is cancelled during use of the actuator, the magnetic field from the coil is cancelled as well. The relative magnetic forces are then no longer applied. Accordingly, the first body and the second body of the guiding device may only be subjected to the elastic forces from the leaf springs of the at least one spring device that has been deformed under the influence of the magnetic field. As a result, the at least one spring device may be moved back towards its equilibrium position, resulting in a back movement of the first body and the second body of the at least one guiding device, and thus of the first object and the second object.

The present invention further provides a lithographic apparatus, comprising one or more guiding devices as described above. The one or more guiding devices may be used for various applications within the lithographic apparatus and may be configured to guide a relative movement between a first component of the lithographic apparatus and a second component of the lithographic apparatus.

This relative movement may be linear movement in a displacement direction or may be a rotational movement in a tangential direction, around a rotational axis. The relative movement may be guided in a range of movement of a spring device of the guiding device, which comprises a range of relative positions between a first body and a second body of the guiding device and which may be defined in between a first extreme position and a second extreme position of the spring device. Within the range of movement, an equilibrium position may be defined as a central position in between the first extreme position and the second extreme position or as a position in which the guiding device is at rest, e.g. when no external actuating forces are applied thereon.

The present invention further provides a lithographic apparatus, comprising:
 a frame,
 a nozzle, and
 a nozzle steering module,
wherein the nozzle steering module is configured to adjust a position and an orientation of the nozzle, wherein the nozzle steering module comprises at least one actuator as described above, preferably three actuators as described above, wherein each of the at least one actuators is connected to the frame and the nozzle, and wherein each of the at least one actuators is configured to adjust a relative position between the nozzle and the frame, in order to adjust the position and the orientation of the nozzle.

The lithographic apparatus according to the present invention comprises a nozzle steering module with at least one of the actuators that are described above, in order to move at least a portion of the nozzle with respect to the frame of the apparatus. As such, the nozzle steering module may be configured to steer a direction along which tin droplets are discharged by the nozzle.

In an embodiment, the nozzle steering module comprises three actuators, which may each be connected to a different portion of the frame and/or to a different portion of the nozzle. As such, the position of the nozzle with respect to the frame may be controlled in six degrees of freedom, e.g. translations in three orthogonal directions and rotations around three orthogonal axes, whereas each of the actuators itself may only have to provide a relative displacement in a displacement direction between the respective portion of the nozzle and the respective portion of the frame.

In a further embodiment of the lithographic apparatus, the three actuators are connected to the nozzle in a triangular pattern and/or the three actuators are connected to the frame in a triangular pattern. This triangular configuration of the actuators may be advantageous in the positioning of the nozzle with respect to the frame in six degrees of freedom.

BRIEF DESCRIPTION OF THE DRAWINGS

Embodiments of the invention will now be described, by way of example only, with reference to the accompanying schematic drawings, in which:

FIG. 5 schematically depicts an embodiment of the guiding device in a deflected position of the spring device;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
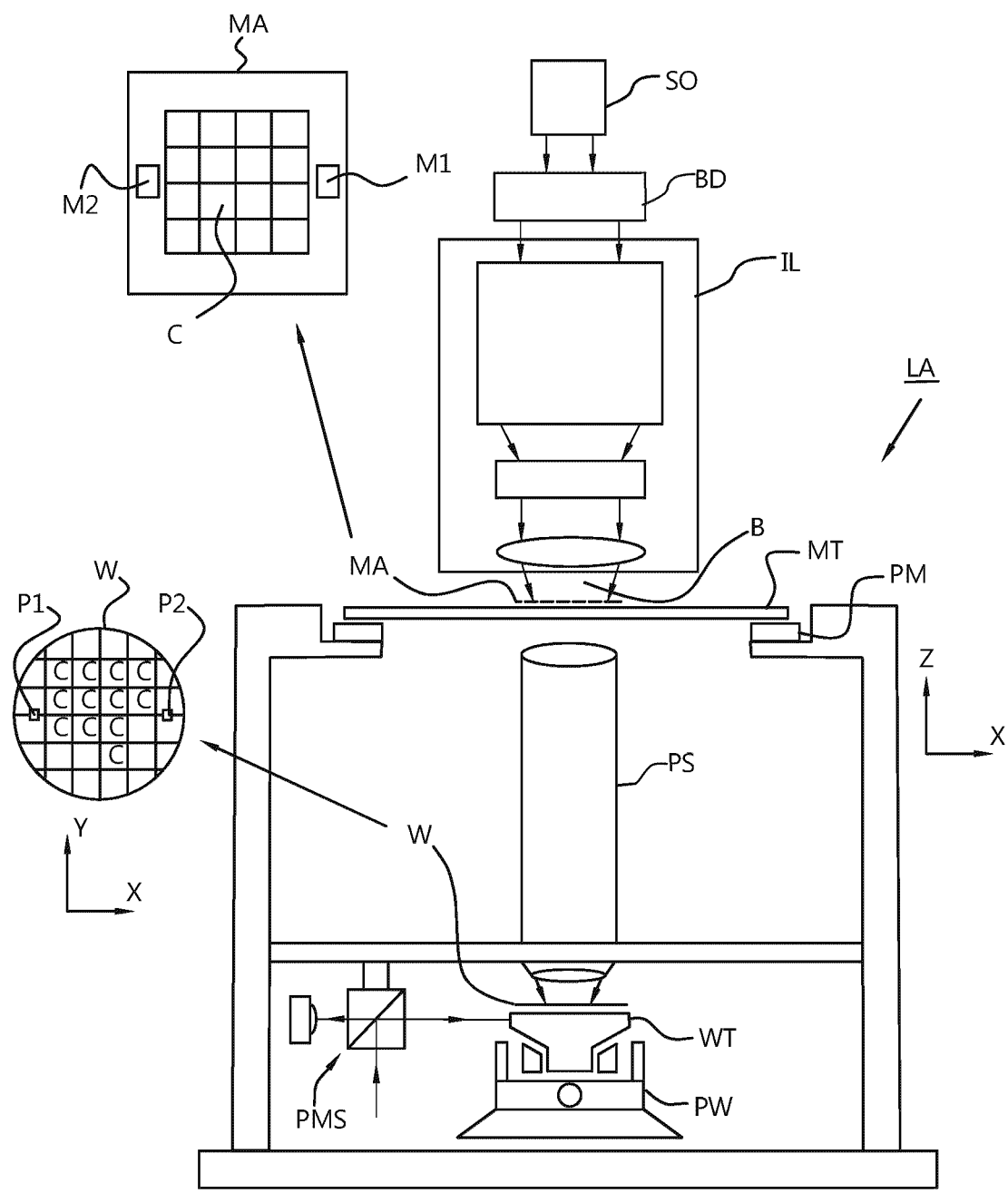
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

The radiation source SO of the lithographic apparatus LA may comprise a nozzle by which droplets of tin are discharged. For the generating of EUV radiation, the droplets of tin are illuminated by a laser, by which ultraviolet radiation is obtained in a desired wavelength spectrum. The position of the nozzle may be controlled by a nozzle steering module (NSM), in order to steer a direction along which tin droplets are discharged. In the present embodiment, the nozzle steering module comprises a plurality of linear actuators for the controlling of the position of the nozzle. These linear actuators are each configured to undergo a change in length. Together, the plurality of linear actuators may control a three-dimensional position of the nozzle.

Figure 2A:
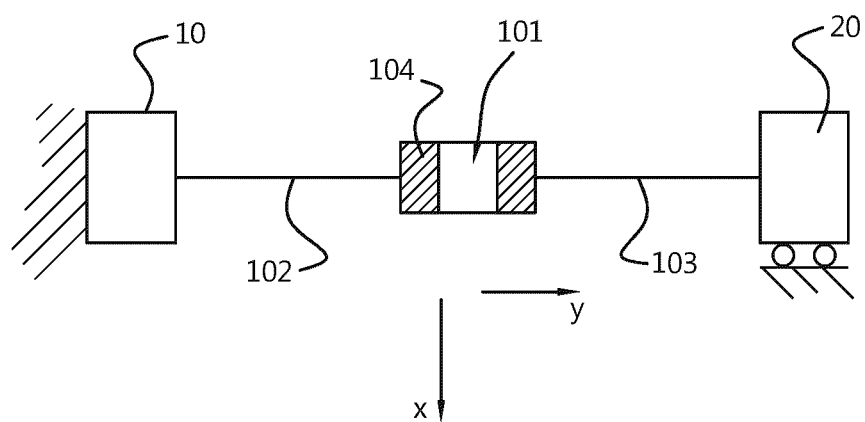
FIG. 2 schematically depict a prior art spring device.

In FIG. 2A, an embodiment of a prior art spring device is displayed, to which is referred with reference numeral 101.

This prior art spring device 101 comprises a leaf spring with a first spring portion 102 that is connected to a first body 10 and second spring portion 103 that is connected to a second body 20. The spring device 101 further comprises a central portion 104, which is arranged in between the first spring portion 102 and the second spring portion 103. The first body 10 is thereby fixedly arranged with respect to its surroundings and the second body 20 is displayed schematically on a rolling support, configured to allow relative movement between the first body 10 and the second body 20 in a y-direction in FIG. 2A and to prevent relative movements between the first body 10 and the second body 20 in an x-direction in FIG. 2A.

In FIG. 2A, the spring device 101 is displayed in its equilibrium position. In the equilibrium position, the first spring portion 102 and the second spring portion 103 are provided in a substantially planar state and substantially extend in the y-direction of FIG. 2A. The spring device 101 may, upon actuation by an external force on the central portion 104 and/or one or more of the first body 10 or the second 20 body, be deflected towards a non-planar state. The spring device 101 is thereby configured to deflect in the x-direction of FIG. 2A, which is perpendicular to the y-direction.

Figure 2B:
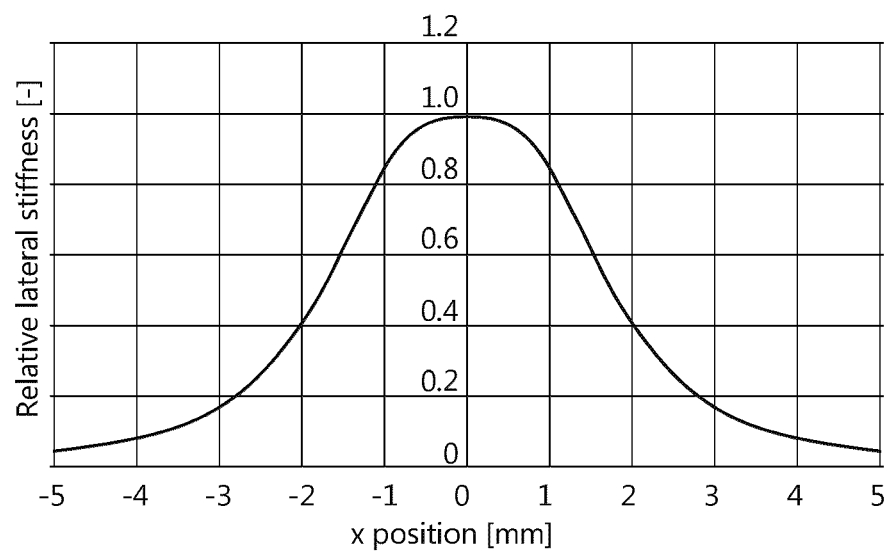

In FIG. 2B, the spring characteristics of the prior art spring device 101 are displayed. On the x-axis of the diagram, the position of the central portion 104 in the x-direction is displayed. The central position at x=0 mm thereby corresponds to the equilibrium position of the spring device 101, as displayed in FIG. 2A. Positive or negative values on the x-axis correspond to deflected positions of the spring device 101 in a range of movement of the spring device 101. On the y-axis of the diagram in FIG. 2B, a normalized in-plane stiffness of the spring device 101 in the y-direction in FIG. 2A, e.g. the relative lateral stiffness, is displayed.

It is shown in FIG. 2B that the in-plane stiffness of the spring device 101 is relatively large when the spring device 101 is in its in-plane state, in the equilibrium position. When the spring device 101 is brought to a non-planar state, upon movement of the central portion 104 in a positive or negative x-direction, the in-plane stiffness in the y-direction is shown to drop dramatically to only a fraction of its stiffness in the planar state at x=0 mm. The drop in in-plane stiffness for deflected positions of the spring device 101 provides the disadvantage that the position of the central portion 104, seen in the y-direction, cannot be controlled as accurately in the deflected positions, when compared to how it can be controlled in the equilibrium position at x=0 mm.

Figure 3A:
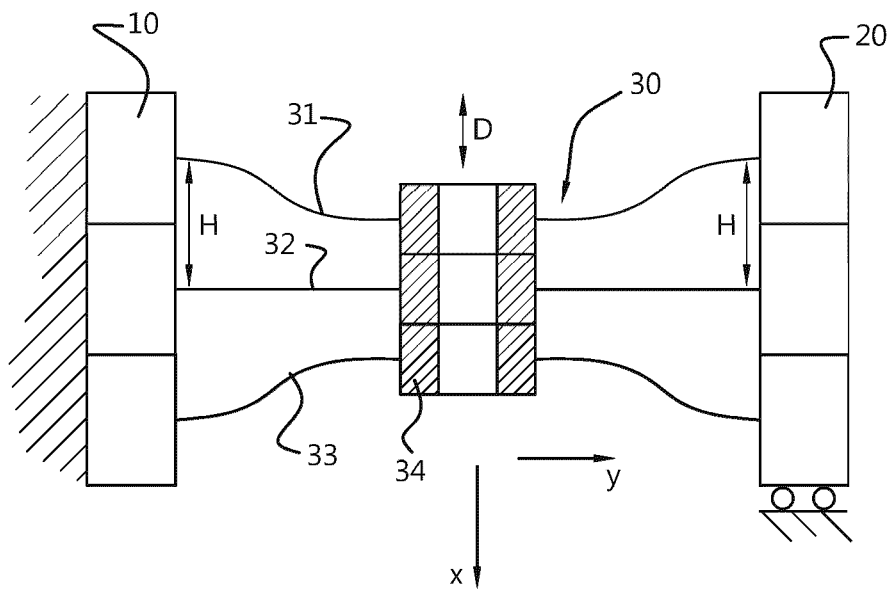
FIG. 3 schematically depicts an embodiment of the spring device.

FIG. 3A shows a schematic representation of an embodiment of the spring device according to the invention, referred to with reference numeral 30. The spring device 30 is arranged between a first body 10 and a second body 20 and is configured to deform in a displacement direction D, parallel to the x-direction in FIG. 3A.

The spring device 30 is arranged between, and connected to the first body 10 and the second body 20 and is configured to guide a linear movement between the bodies 10, 20 and a central portion 34 of the spring device 30. The spring device 30 comprises a first leaf spring 31, a second leaf spring 32 and a third leaf spring 33. Each of the leaf springs 31, 32, 33 is thereby connected to the first body 10 and to the second body 20 and is configured to deform upon relative movements between the first body 10 and the second body 20.

The leaf springs 31, 32, 33 of the spring device 30 are provided as plate-like elements, which extend in a plane that is perpendicular to the displacement direction D, e.g. parallel to the y-direction in FIG. 3A. In FIG. 3A, the spring device 30 is arranged in its equilibrium position, in which the first leaf spring 31 and the third leaf spring 33 are both in a non-planar state. The non-planar first and third leaf springs 31, 33 have a curved shape in the equilibrium position and have been deformed into this non-planar state from their respective planar states. The first leaf spring 31 is thereby curved in a downward direction in FIG. 3A and the third leaf spring 33 is curved in an upward direction. The second leaf spring 32 of the spring device 30 is in a planar state in the equilibrium position, as is displayed in FIG. 3A. In this planar state, the second leaf spring 32 is provided as a two-dimensional plate, having a substantially straight shape. In the central portion 34 of the spring device 30, the first leaf spring 31, the second leaf spring 32 and the third leaf spring 33 are fixedly connected to each other.

Figure 3B:
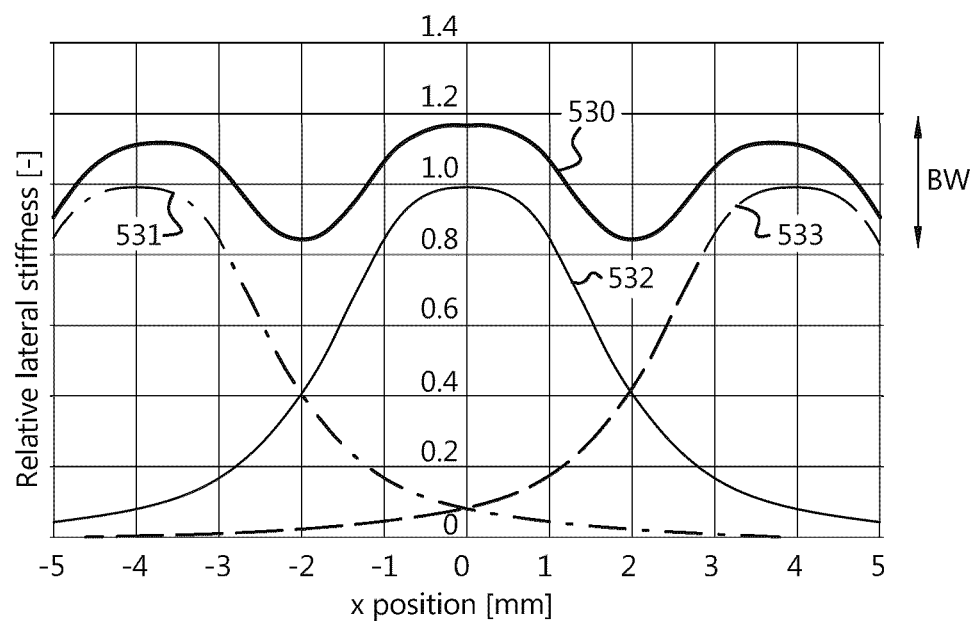

In FIG. 3B, the spring characteristics of the spring device 30 of FIG. 3A are displayed. The diagram of FIG. 3B displays, similar as in FIG. 2B, the position of the central portion 34 in the x-direction on the x-axis. On the y-axis, the normalized in-plane stiffness in the y-direction in FIG. 3A of the spring device 30, e.g. the relative lateral stiffness, is displayed.

In FIG. 3B, the stiffnesses 531, 532, 533 of the individual leaf springs 31, 32, 33 are displayed. The peaks of the stiffnesses 531, 532, 533 are offset on the x-axis with respect to each other. A spacing between the peaks, e.g. 4 mm in FIG. 3B, thereby corresponds to a spacing H between the leaf springs 31, 32, 33 in FIG. 3A at the point where they are connected to the first body 10 and the second body 20. FIG. 3B further displays an overall in-plane stiffness 530 of the spring device 30, which corresponds to the sum of the in-plane stiffnesses 531, 532, 533 of the individual leaf springs 31, 32, 33 at each position of the central portion 34.

The spring device 30 in FIG. 3A at least partially overcomes the disadvantage of the prior art spring device 101 in FIG. 2A, since it comprises two non-planar leaf springs 31, 33 and one planar leaf spring 32 in the equilibrium position of the spring device 30. The non-planar leaf springs 31, 33 have a relatively small in-plane stiffness 531, 533 in the equilibrium position, e.g. at x=0 mm in FIG. 3B. The overall in-plane stiffness 530 of the spring device 30 is, however, compensated by the second leaf spring 32 that is in its planar state in the equilibrium position, at x=0 mm. This planar leaf spring 32 has a relatively large in-plane stiffness for x=0 mm and thus forms a major contribution to the overall in-plane stiffness 530 of the spring device 30.

When the first body 10, the second body 20 and the central portion 34 of the spring device 34 are, from the equilibrium position, moved with respect to each other within the range of movement in the displacement direction D, either one of the non-planar leaf springs 31, 33 is deformed towards a planar state. Accordingly, the planar second leaf spring 32 is deformed towards a non-planar state. This movement may take place from the equilibrium position of the spring device 30 towards a first extreme position or a second extreme position. In the embodiment of FIG. 3, the first extreme position corresponds to an upward displacement of the central portion 34 that amounts 5 mm, towards x=−5 mm in FIG. 3B. The second extreme position corresponds to a downward displacement of the central portion 34 that also amounts 5 mm, towards x=5 mm in FIG. 3B.

Upon upward displacement of the central portion 34, the in-plane stiffness 531 of the first leaf spring 31 is increased as it is deformed towards its planar state. The in-plane stiffness 532 of the second leaf spring 32 is decreased upon deformation towards its non-planar state. Furthermore, the in-plane stiffness 533 of the third leaf spring 33 is decreased even further upon further upward movement of the central portion 34. The overall in-plane stiffness 530 of the spring device 30 remains relatively high, although the major contribution thereto is shifted from the second leaf spring 32 towards the first leaf spring 31.

During this upward displacement, the first leaf spring 31 is brought from a state in which it has a relatively small in-plane stiffness, for example at x=0 mm, towards a state in which it has a relatively large in-plane stiffness, for example at x=−4 mm. In the equilibrium position of the spring device 30, at x=0 mm, the contribution of the first leaf spring 31 to the overall in-plane stiffness 530 of the spring device 30 is relatively small, whereas its contribution is relatively large in the deflected position of the spring device 30, at x=−4 mm.

Accordingly, the second leaf spring 32 is brought from a state in which it has a relatively large in-plane stiffness, for example at x=0 mm, towards a state in which it has a relatively small in-plane stiffness, for example at x=−4 mm. In the equilibrium position of the spring device 30, at x=0 mm, the contribution of the second leaf spring 32 to the overall in-plane stiffness 530 of the spring device 30 is relatively large, whereas its contribution is relatively small in the deflected position of the spring device 30, at x=−4 mm.

When the first body 10, the second body 20 and the central portion 34 were to be moved back towards the equilibrium position of the spring device 30, the first leaf spring 31 is returned from a planar state towards its non-planar state and the second leaf spring 32 is returned from a non-planar state towards its planar state.

The spring device 30 in FIG. 3A is configured to provide a relatively constant overall in-plane stiffness 530 upon relative movements between the first body 10, the second body 20 and the central portion 34 in the range of movement. The spring device 30 thereby prevents a significant drop in the overall in-plane stiffness 530 from taking place and thus provides for substantially linear relative movements of the central portion 34, without having relative movements in orthogonal directions to the displacement direction D, e.g. in the y-direction.

The spring device 30 in FIG. 3A comprises three identical leaf springs 31, 32, 33, being identical in terms of dimensions and/or materials. As such, the mechanical properties and spring characteristics of the leaf springs 31, 32, 33 are identical or at least similar. In an alternative embodiment, the leaf springs may have different dimensions and/or may be made from a different material, in order to provide for different spring characteristics and to allow for tuning of the overall spring characteristics of the spring device.

In the embodiment of the spring device 30, the first leaf spring 31 and the third leaf spring 33 are stress-relaxed. As such, these leaf springs 31, 33 have a curved and deflected shape in the equilibrium position and are not substantially pre-loaded with elastic deformation stresses. The stress relaxation provides the advantage that these leaf springs 31, 33 only become stressed when the spring device 30 is brought towards a deflected position. Furthermore, the stress-relaxed first and third leaf springs 31, 33 are configured to force the spring device 30 back towards its equilibrium position when an external force, that holds the spring device 30 in the deflected position, is taken away. As such, the first body 10, the second body 20 and the central portion 34 are returned to an initial relative position that corresponds to the equilibrium position of the spring device 30.

In the embodiment of FIG. 3A, the overall in-plane stiffness 530 of the spring device is substantially within a bandwidth BW, as displayed in FIG. 3B. The overall in-plane stiffness 530 has a maximum value in the equilibrium position of the spring device 30, at x=0 mm, as well as in deflected positions of the spring device 30 in which the first leaf spring 31 and the third leaf spring 33 are in their planar states, respectively at x=−4 mm and x=4 mm. In between the equilibrium position and the deflected positions, e.g. at x=−2 mm and x=2 mm, the overall in-plane stiffness 530 is lower than the maximum value, defining a minimum value for the bandwidth BW of the overall in-plane stiffness 30. In the shown embodiment, the minimum value of the overall in-plane stiffness 530 is approximately 70% of the maximum value.

Figure 4A:
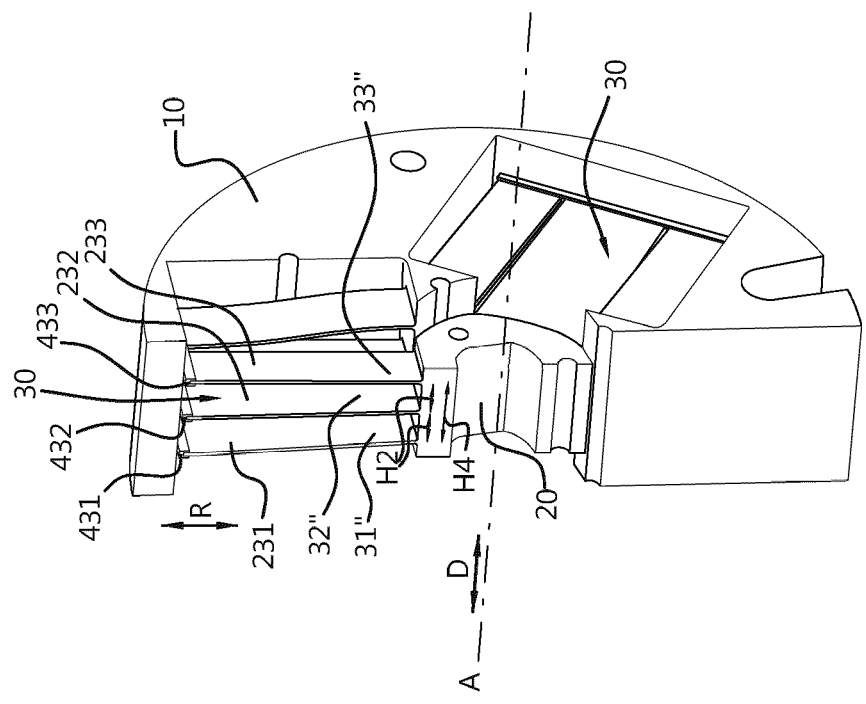
FIG. 4 schematically depicts an embodiment of the guiding device in an equilibrium position of the spring device.
Figure 4B:
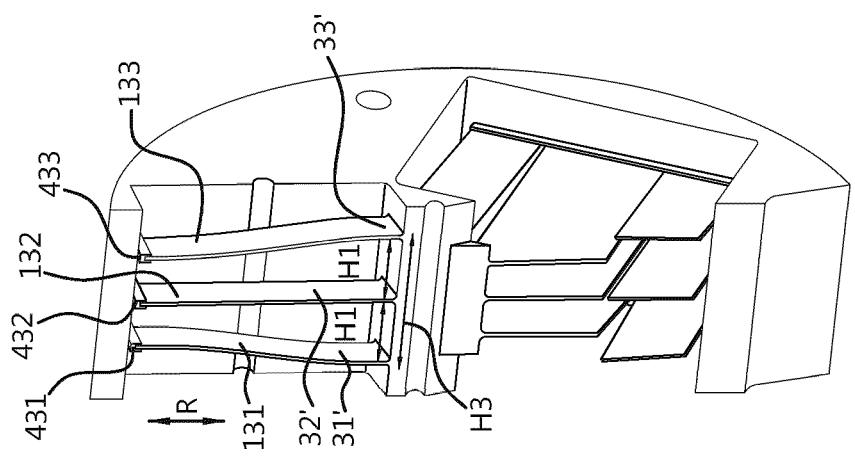

In FIGS. 4A and 4B, an embodiment is displayed of the guiding device according to the present invention, to which is referred with reference numeral 1. The guiding device 1 comprises a first body 10 and a second body 20, which are configured to be moved with respect to each other in a displacement direction D. The guiding device 1 comprises three spring devices 30, which are each connected to the first body 10 and the second body 20 and which are configured to guide the relative movements between the bodies 10, 20 within a range of movement.

The first body 10 is provided as an annular ring with a central opening there through. The second body 20 is provided as a longitudinal shaft, which extends in an axial direction A, parallel to the displacement direction D, and which is arranged partially in the opening in the annular ring 10. In FIG. 4A, a portion of the annular ring 10 and the longitudinal shaft 20 is omitted for clarity purposes.

The three spring devices 30 of the guiding device 1 are evenly disposed around the longitudinal shaft 20, and extend between the shaft 20 and the ring 10. It is noted that FIGS. 4A and 4B display the spring devices 30 at a 12 o'clock position and a 4 o'clock position, seen in a plane perpendicular to the axial direction A. The spring device at the 8 o'clock position is omitted for clarity purposes.

In this configuration, the three spring devices 30 are disposed within the annular ring 10 and are evenly spaced with respect to each other over an angle of 120 degrees. When one of the three spring devices 30 would, in this configuration, apply a relative force in a first radial direction between the ring 10 and the shaft 20, the other two spring devices 30 will compensate for this radial force, since the leaf springs of both of the other spring devices 30 are configured to apply spring forces in directions that have a component parallel to the first radial direction.

In the embodiment of FIG. 4, each of the spring devices 30 comprises a first leaf spring 31, a second leaf spring 32 and a third leaf spring 33. The first leaf spring 31 is, with a first end 31', connected to the first body 10 and, with a second end 31", connected to the second body 20. The second leaf spring 32 is, with a first end 32', connected to the first body 10 and, with a second end 32", connected to the second body 20. The third leaf spring 33 is, with a first end 33', connected to the first body 10 and, with a second end 33", connected to the second body 20. In FIG. 4B, the second body 20 and the second ends 31", 32", 33" of the leaf springs 31, 32, 33 are displayed and are omitted in FIG. 4A for clarity purposes.

In the embodiment of FIG. 4, each of the leaf springs 31, 32, 33 comprises a first leaf 131, 132, 133 and a second leaf 231, 232, 233. Each of the first leafs comprises, seen from the first body 10, a proximal end and an opposing distal end. The proximal end of the first leaf thereby forms the first end of the respective leaf spring. The second leaf comprises, seen from the second body 20, a proximal end and an opposing distal end. The proximal end of the second leaf thereby forms the second end of the respective leaf spring. The distal end of the first leaf is fixedly connected to the distal end of the second leaf, thereby forming connection points 431, 432, 433 of the respective leaf springs 31, 32, 33.

When the second body 20 is moved with respect to the first body 10 in the displacement direction D, the proximal end of the second leaf, being connected to the second body 20, is moved away from the proximal end of the first leaf that is connected to the first body 10. Upon this movement, the first leaf and the second leaf of the leaf spring are both deformed, whereas the connection point between both leafs is also moved with respect to both the first body 10 and the second body 20. As a result hereof, the deformed leaf spring may be symmetrical in a plane through the connection point and perpendicular to the displacement direction D. Accordingly, a possible change in height of the first leaf, perpendicular to the displacement direction D, is compensated by a similar change in height of the second leaf. As such, these compensations prevent the occurrence of relative movements between the first body 10 and the second body 20 in directions perpendicular to the displacement direction D.

As displayed in FIG. 4A, the first end 32' of the second leaf spring 32 is, in the displacement direction D, spaced at a first distance H1 from the first end 31' of the first leaf spring 31. The first end 33' of the third leaf spring 33 is, in the displacement direction D, spaced at a third distance H3 from the first end 31' of the first leaf spring 31 and at the first distance H1 from the first end 32' of the second leaf spring 32.

As displayed in FIG. 4B, the second end 32" of the second leaf spring 32 is, in the displacement direction D, spaced at a second distance H2 from the second end 31" of the first leaf spring 31. The second end 33" of the third leaf spring 33 is, in the displacement direction D, spaced at the second distance H2 from the second end 32" of the second leaf spring 32 and at a fourth distance H4 from the first end 31' of the first leaf spring 31. The first distance H1 is thereby larger than the second distance H2. The third distance H3 and fourth distance H4 are thereby larger than the second distance H2 as well.

The range of movement of the spring device 30 in FIG. 4 is defined between a first extreme position and a second extreme position. Seen from the equilibrium position that is displayed in FIG. 4, the first extreme position corresponds to a relative movement to the right between the bodies 10, 20 over a distance that is slightly larger than H1 minus H2. Accordingly, the second extreme position corresponds to a relative movement to the left between the bodies 10, 20 over a distance that is slightly larger than H1 minus H2 as well. As such, the first and second extreme positions are respectively defined at displacements that are slightly beyond the point at which respectively the third leaf spring 33 and the first leaf spring 31 are in their planar states.

According to the embodiment in FIG. 4, a spacing between the first leaf spring 31, the second leaf spring 32 and the third leaf spring 33 is larger at their respective first ends 31', 32', 33' than at their respective second ends 31", 32", 33". As such, the leaf springs are not aligned parallel to each other in between the first body 10 and the second body 20. Furthermore, this configuration of the leaf springs provides that when a first one of the leaf springs is in its non-planar state, having a relatively small in-plane stiffness, a second one of the leaf springs may be in its planar state, having a relatively large in-plane stiffness.

It is shown in FIG. 4, in which the spring device 30 is in its equilibrium position, that the first leaf spring 31 and the third leaf spring 33 are in their non-planar state and that the second leaf spring 32 is in its planar state. In this configuration, the in-plane stiffness of the first leaf spring 31 and the third leaf spring 33 is relatively low. However, the overall in-plane stiffness in the equilibrium position of the spring device 30, in a radial direction R with respect to the axial direction A, is substantially large, due to the contribution of the planar second leaf spring 32.

Furthermore, the characteristics for the overall in-plane stiffness of the spring device 30 may be set by selecting appropriate values for the first distance H1, second distance H2, third distance H3 and/or fourth distance H4 between the leaf springs.

In FIG. 5, the guiding device 1 of FIG. 4 is displayed, which is arranged in a deflected position. In the deflected position, the second body 20 has been moved in the displacement direction D to the right with respect to the first body 10. In the deflected position in FIG. 5, the second leaf spring 32 is no longer in its planar state. Instead, the third leaf spring 33 is in its planar state. The first leaf 133 of the third leaf spring 33 is thereby arranged in line with the second leaf 233 of the third leaf spring 33. Accordingly, the first leaf spring 31 and the second leaf spring 32 are in their non-planar state, having a curved shape.

In the deflected position in FIG. 5, the in-plane stiffness of the third leaf spring 33 is relatively large, whereas the in-plane stiffnesses of the first leaf spring 31 and the second leaf spring 32 are relatively low. The overall in-plane stiffness of the spring device 30, in a radial direction R with respect to the axial direction A, is thus mainly provided by the third leaf spring 33.

Figure 6A:
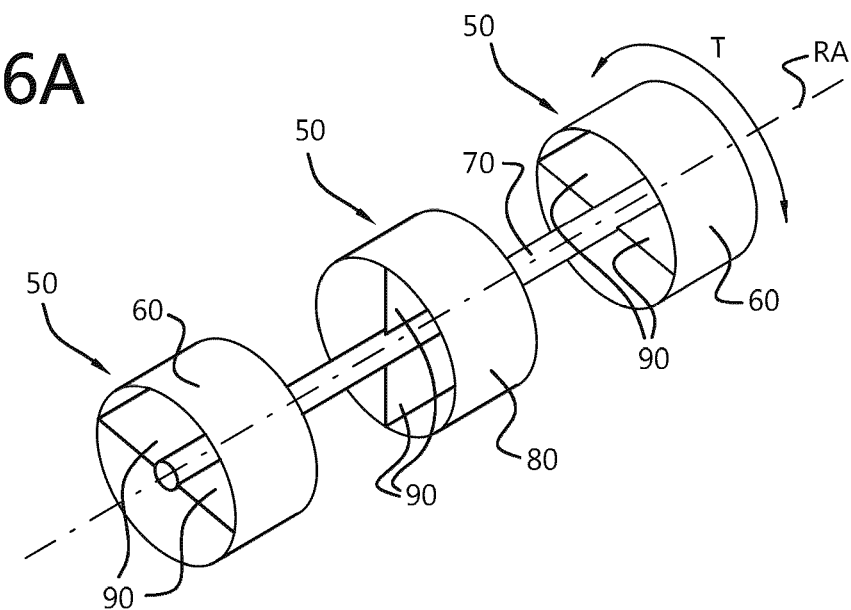
FIG. 6 schematically depicts an alternative embodiment of the guiding device.
Figure 6B:
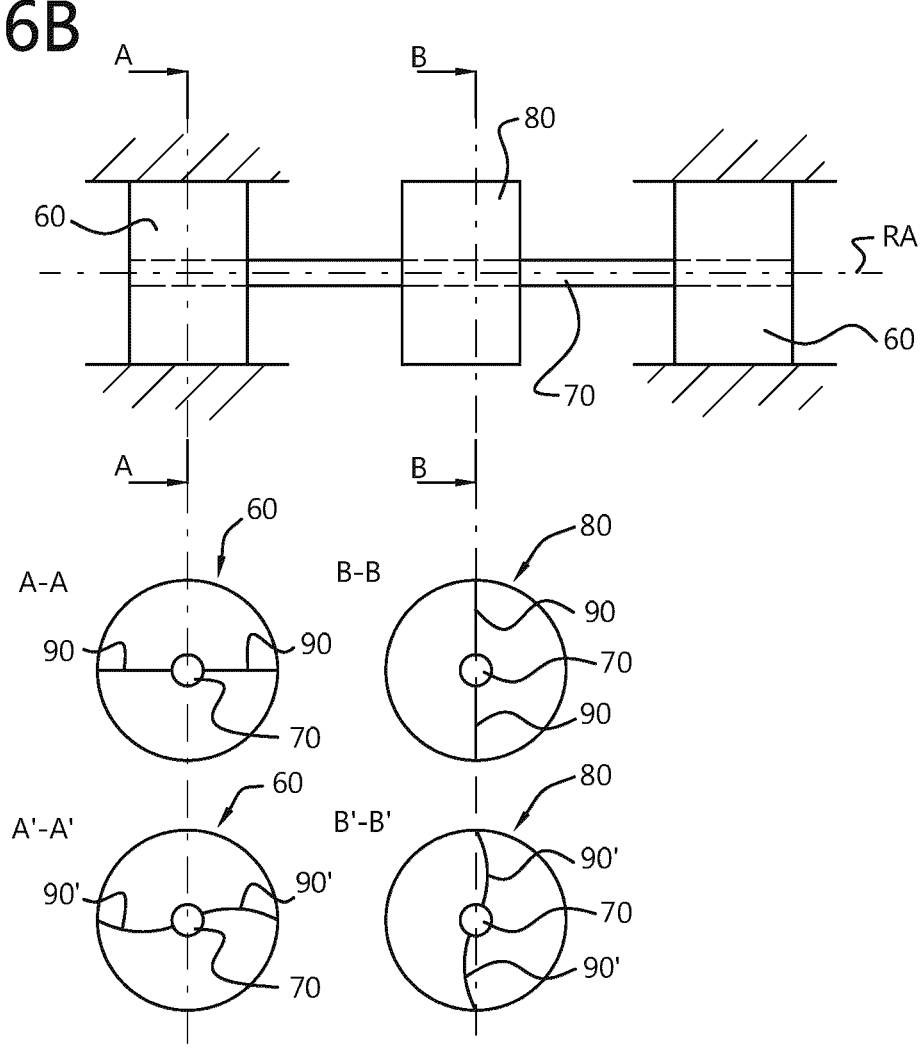

In FIG. 6, an alternative embodiment of the guiding device is displayed, to which is referred with reference numeral 50. The guiding device 50 in FIG. 6 is configured to guide a rotational movement between two first bodies 60 and a second body 70 in a tangential direction T, around a rotational axis RA, and to guide a rotational movement between the second body 70 and a third body 80 in the tangential direction T. The first bodies 60 are provided as annular rings that are fixedly connected to their surroundings. The second body 70 is provided as a longitudinal shaft, which extends along the rotational axis RA and which is arranged within the first bodies 60. The third body 80 is also provided as an annular ring, which is located in between both first bodies 60 and which is provided around the second body 70, e.g. the longitudinal shaft, as well.

In the embodiment of FIG. 6, the first body 60, the second body 70 and the third body 80 are arranged concentrically with respect to each other along the rotational axis RA and may be configured to be rotated with respect to each other around this common rotational axis, in the tangential direction T. The guiding device 50 comprises a respective set of two spring devices 90 between each of the first bodies 60 and the second body 70, e.g. the longitudinal shaft, and comprises a set of two spring devices 90 between the second body 70, e.g. the longitudinal shaft, and the third body 80.

Both spring devices 90 in a set of spring devices 90 are arranged opposite to each other, being spaced over an angle of 180 degrees. Such a rotation-symmetrical arrangement of the spring devices 90 provides that, during relative movements between the bodies, the spring devices 90 are together configured to compensate transverse forces between the bodies. As such, only relative rotations are allowed between the bodies and relative displacements between the bodies are prevented from occurring.

In FIG. 6, it is displayed that the spring devices 90 between the first body 60 and the second body 70, as displayed in cross-sections A-A and A'-A', are aligned substantially horizontal. The spring devices 90 between the second body 70 and the third body 80, as displayed in cross-sections B-B and B'-B', are aligned substantially vertical.

Each of the spring devices 90 comprises three leaf springs, which extend in a direction that is aligned radially with respect to the rotation axis RA. The leaf springs of the spring devices 90 are configured to deform in the tangential direction T upon relative rotation between the respective bodies 60, 70, 80. In FIG. 6, the three leaf springs of each of the spring devices 90 are displayed schematically as a single leaf spring, whereas FIG. 7 displays the three leaf springs in more detail.

Figure 7A:
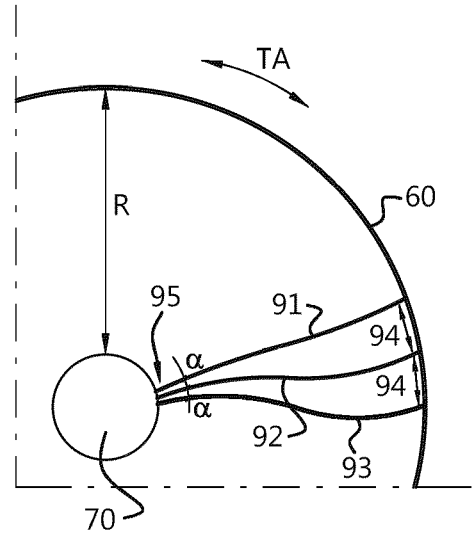
FIG. 7 schematically depicts a close-up view on a spring device of the guiding device in FIG. 6.
Figure 7B:
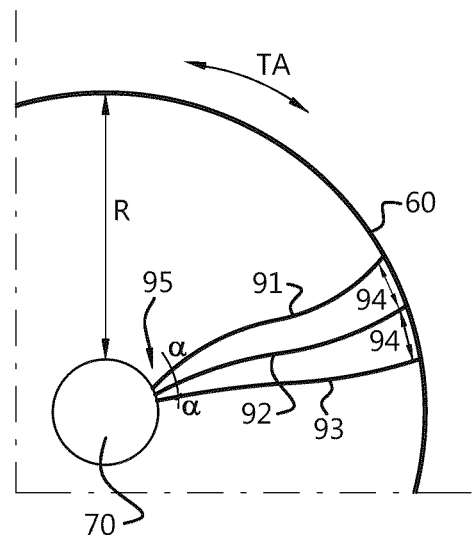

In FIG. 7, a spring device 90 of the guiding device 50 of FIG. 6 is displayed in more detail. In FIG. 7A, the spring device 90 is displayed in a first deflected position and in FIG. 7B, the spring device 90 is in a second deflected position, being rotated in the tangential direction TA with respect to the first deflected position in FIG. 7A.

The spring device 90 comprises a first leaf spring 91, a second leaf spring 92 and a third leaf spring 93. Each of the leaf springs 91, 92, 93 is, with a first end, connected to the first body 60 and is, with an opposing second end, connected to the second body 70. The first ends of the leaf springs 91, 92, 93 are, in the tangential direction TA, spaced over a first angle 94 from each other. Similarly, the opposing second ends of the leaf springs 91, 92, 93 are, in the tangential direction TA, spaced over a second angle 95 from each other, which is indicated in FIG. 7 by means of line α-α. The first angle 94 is larger than the second angle 95, which implies that a spacing in the tangential direction TA between the leaf springs 91, 92, 93 is larger near the first body 60 than near the second body 70. As such, the leaf springs 91, 92, 93 may not be aligned parallel to each other in between the first body 60 and the second body 70.

This non-parallel configuration of the leaf springs 91, 92, 93 provides that in the first deflected position of the spring device 90, as is displayed in FIG. 7A, the first leaf spring 91 is in its planar state, being provided as a substantially two-dimensional plate, having a substantially straight shape. The planar first leaf spring 91 thereby has a relatively large in-plane stiffness in a radial direction R. The second leaf spring 92 and the third leaf spring 93 are in their respective non-planar states, having a curved shape and a relatively small in-plane stiffness in the radial direction R. The overall in-plane stiffness in the first deflected position of the spring device 90, in a radial direction R, is substantially large, due to the contribution of the planar first leaf spring 91.

In FIG. 7B, the first body 60 and the second body 70 have been rotated with respect to each other in the tangential direction TA. The spring device 90 has thereby been brought into its second deflected position. In the second deflected position, the first leaf spring 91 is no longer in its planar state. Instead, the third leaf spring 93 is in its planar state, having a substantially straight shape. Accordingly, the first leaf spring 91 and the second leaf spring 92 are in their non-planar state, having a curved shape.

In the deflected position in FIG. 7B, the in-plane stiffness of the third leaf spring 93 is relatively large, whereas the in-plane stiffnesses of the first leaf spring 91 and the second leaf spring 92 are relatively low. The overall in-plane stiffness of the spring device 90, in a radial direction R, is thus mainly provided by the planar third leaf spring 93.

GENERAL STATEMENTS

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An actuator configured to move a first object with respect to a second object, the actuator comprising:
a first body comprising an annular ring,
a second body, arranged movably with respect to the first body, comprising a longitudinal shaft that is at least partially disposed within the annular ring,
at least one spring device, arranged between the first body and the second body, wherein the at least one spring device is configured to guide relative movements between the first body and the second body in a range of movement,
a coil, comprising one or more coil windings, and
a permanent magnet, arranged within the one or more coil windings,
wherein the first body is connected or adapted to be connected to the first object and wherein the second body is connected or adapted to be connected to the second object,
wherein the coil is associated with one of the first body or the second body and the permanent magnet is associated with the other one of the first body or the second body,
wherein the coil is configured to generate a magnetic field when an electric current is applied through the one or more windings and wherein the generated magnetic field is configured to attract or repel the permanent magnet in order to move the first body with respect to the second body in a displacement direction or a tangential direction, respectively, and
wherein the at least one spring device comprises two or more leaf springs, wherein each of the two or more leaf springs is connected to the first body and to the second body, wherein at least one of the leaf springs is in a non-planar state when the spring device is in an equilibrium position.

2. The actuator according to claim 1, wherein the leaf spring that is non-planar in the equilibrium position is adapted to be arranged in a planar state when the spring device is moved towards a deflected position in the range of movement.

3. The actuator according to claim 1, wherein at least another one of the leaf springs is in a planar state when the spring device is in its equilibrium position.

4. The actuator according to claim 3, wherein the leaf spring that is planar in the equilibrium position is adapted to be arranged in a non-planar state when the spring device is moved towards a deflected position in the range of movement.

5. The actuator according to claim 1, wherein the leaf spring that is non-planar in the equilibrium position is stress-relaxed.

6. The actuator according to claim 1, configured to guide a linear movement between the first body and the second body in a displacement direction.

7. The actuator according to claim 6, wherein each at least one spring device comprises a first leaf spring and a second leaf spring,
wherein the first leaf spring is, with a first end, connected to the first body and, with a second end, connected to the second body,
wherein the second leaf spring is, with a first end, connected to the first body and, with a second end, connected to the second body,
wherein the first end of the second leaf spring is, in the displacement direction, spaced at a first distance from the first end of the first leaf spring,
wherein the second end of the second leaf spring is, in the displacement direction, spaced at a second distance from the second end of the first leaf spring, and
wherein the first distance is larger than the second distance.

8. The actuator according to claim 7, wherein each at least one spring device further comprises a third leaf spring,
wherein the third leaf spring is, with a first end, connected to the first body and, with a second end, connected to the second body,
wherein the first end of the third leaf spring is, in the displacement direction, spaced at a third distance from the first end of the first leaf spring,
wherein the second end of the third leaf spring is, in the displacement direction, spaced at the second distance from the second end of the first leaf spring and the second end of the second leaf spring, and
wherein the third distance is larger than the second distance.

9. The actuator according to claim 6, wherein each of the leaf springs comprises a first leaf and a second leaf,
wherein the first leaf comprises, seen from the first body, a proximal end and an opposing distal end, wherein the proximal end of the first leaf forms the first end of the respective leaf spring,
wherein the second leaf comprises, seen from the second body, a proximal end and an opposing distal end, wherein the proximal end of the second leaf forms the second end of the respective leaf spring, and wherein the distal end of the first leaf is fixedly connected to the distal end of the second leaf.

10. The actuator according to claim 1, configured to guide a rotational movement between the first body and the second body in a tangential direction, around a rotational axis.

11. The actuator according to claim 10,
wherein each at least one spring device comprises a first leaf spring and a second leaf spring,
wherein the first leaf spring is, with a first end, connected to the first body and, with a second end, connected to the second body,
wherein the second leaf spring is, with a first end, connected to the first body and, with a second end, connected to the second body,
wherein the first end of the second leaf spring is, in the tangential direction, spaced over a first angle from the first end of the first leaf spring,
wherein the second end of the second leaf spring is, in the tangential direction, spaced over a second angle from the second end of the first leaf spring, and
wherein the first angle is larger than the second angle.

12. The actuator according to claim 11, wherein each at least one spring device further comprises a third leaf spring,
wherein the third leaf spring is, with a first end, connected to the first body and, with a second end, connected to the second body,
wherein the first end of the third leaf spring is, in the tangential direction, spaced over a third angle from the first end of the first leaf spring,
wherein the second end of the third leaf spring is, in the tangential direction, spaced over the second angle from the second end of the first leaf spring and the second end of the second leaf spring, and
wherein the third angle is larger than the second angle.

13. The actuator according to claim 1, wherein the at least one spring device comprises at least two spring devices, which are evenly disposed around the shaft, in between the ring and the shaft.

14. The actuator according to claim 13, wherein the at least one spring device comprises three spring devices, which are evenly disposed around the shaft.

15. A lithographic apparatus, comprising:
a frame,
a nozzle, and
a nozzle steering module comprising at least one actuator according to claim 1, wherein each actuator at least one actuator is connected to the frame and the nozzle, and
wherein each actuator at least one actuator is configured to adjust a relative position between the nozzle and the frame, in order to adjust a position and an orientation of the nozzle.

16. The lithographic apparatus according to claim 15, wherein at least one actuator comprises three actuators connected to the nozzle in a triangular pattern, and/or connected to the frame in a triangular pattern.

17. An actuator comprising:
a first body comprising a ring,
a second body, arranged movably with respect to the first body, comprising a shaft that is at least partially disposed within the ring,
at least one spring device, arranged between the first body and the second body, wherein the at least one spring device is configured to guide relative movements between the first body and the second body in a range of movement,
a coil, comprising one or more coil windings, and
a magnet, arranged within the one or more coil windings,
wherein the coil is associated with one of the first body or the second body and the magnet is associated with the other one of the first body or the second body,
wherein the coil is configured to generate a magnetic field when an electric current is applied through the one or more windings and wherein the generated magnetic field is configured to attract or repel the magnet in order to move the first body with respect to the second body in a displacement direction or a tangential direction, respectively, and
wherein the at least one spring device comprises two or more leaf springs, wherein each of the two or more leaf springs is connected to the first body and to the second body, wherein at least one of the leaf springs is in a non-planar state when the spring device is in an equilibrium position.

18. The actuator according to claim 17, wherein the leaf spring that is non-planar in the equilibrium position is adapted to be arranged in a planar state when the spring device is moved towards a deflected position in the range of movement.

19. The actuator according to claim 17, wherein at least another one of the leaf springs is in a planar state when the spring device is in its equilibrium position.

20. An apparatus, comprising:
a frame;
a nozzle; and
a nozzle steering module comprising at least one actuator according to claim 17,
wherein each actuator at least one actuator is connected to the frame and the nozzle, and
wherein each actuator at least one actuator is configured to adjust a relative position between the nozzle and the frame, in order to adjust a position and an orientation of the nozzle.

* * * * *